(12) United States Patent
Oh

(10) Patent No.: US 8,897,090 B2
(45) Date of Patent: Nov. 25, 2014

(54) MEMORY SYSTEM HAVING A PLURALITY OF SERIALLY CONNECTED DEVICES

(71) Applicant: MOSAID Technologies Incorporated, Ottawa (CA)

(72) Inventor: HakJune Oh, Ottawa (CA)

(73) Assignee: Conversant Intellectual Property Management Incorporated, Ottawa, Ontario (CA)

( * ) Notice: Subject to any disclaimer, the term of this patent is extended or adjusted under 35 U.S.C. 154(b) by 0 days.

(21) Appl. No.: 14/045,857

(22) Filed: Oct. 4, 2013

(65) Prior Publication Data

US 2014/0029347 A1    Jan. 30, 2014

Related U.S. Application Data

(63) Continuation of application No. 12/782,911, filed on May 19, 2010, now Pat. No. 8,582,382.

(60) Provisional application No. 61/316,427, filed on Mar. 23, 2010.

(51) Int. Cl.
| | | |
|---|---|---|
| G11C 7/00 | (2006.01) | |
| G11C 7/22 | (2006.01) | |
| G11C 16/08 | (2006.01) | |
| G11C 16/06 | (2006.01) | |
| G11C 7/10 | (2006.01) | |
| G11C 16/32 | (2006.01) | |

(52) U.S. Cl.
CPC .... *G11C 16/06* (2013.01); *G11C 7/22* (2013.01); *G11C 16/08* (2013.01); *G11C 7/10* (2013.01); *G11C 16/32* (2013.01)
USPC ............. 365/221; 365/189.17; 365/233.1

(58) Field of Classification Search
USPC .................. 365/221, 189.17, 233.1
See application file for complete search history.

(56) References Cited

U.S. PATENT DOCUMENTS

2010/0306570 A1*  12/2010  Uchida et al. ............ 713/600

* cited by examiner

*Primary Examiner* — Han Yang
(74) *Attorney, Agent, or Firm* — Winstead PC

(57) ABSTRACT

A semiconductor memory device and system are disclosed. The memory device includes a memory, a plurality of inputs, and a device identification register for storing register bits that distinguish the memory device from other possible memory devices. Circuitry for comparing identification bits in the information signal with the register bits provides positive or negative indication as to whether the identification bits match the register bits. If the indication is positive, then the memory device is configured to respond as having been selected by a controller. If the indication is negative, then the memory device is configured to respond as having not been selected by the controller. A plurality of outputs release a set of output signals towards a next device.

17 Claims, 15 Drawing Sheets

| COMMAND | COMMAND CYCLE 1 | # OF ADDRESS CYCLES | DATA CYCLES REQUIRED | COMMAND CYCLE 2 | VALID DURING BUSY |
|---|---|---|---|---|---|
| PAGE READ | 00h | 5 | NO | 30h | NO |
| RANDOM DATA OUTPUT | 05h | 2 | NO | E0h | NO |
| READ STATUS | 70h | - | NO | - | YES |
| PAGE PROGRAM | 80h | 5 | YES | 10h | NO |
| RANDOM DATA INPUT | 85h | 2 | YES | - | NO |
| BLOCK ERASE | 60h | 3 | NO | 00h | NO |
| RESET | FFh | - | NO | - | YES |

FIG. 2

MEMORY SYSTEM HAVING A PLURALITY OF SERIALLY CONNECTED DEVICES

CROSS-REFERENCE TO RELATED APPLICATION

This application is a continuation of Ser. No. 12/782,911 filed May 19, 2010, which claims the benefit of priority of U.S. Provisional Patent Application Ser. No. 61/316,427 filed Mar. 23, 2010, the disclosures of which are incorporated herein by reference in their entireties.

BACKGROUND

Non-volatile memory devices are in use today for storing digital pictures, computer files, digitally recorded music and so on. It is common to find non-volatile memory devices in everyday electronics such as computers, digital cameras, MP3 players, answering machines, cell phones, etc.

Non-volatile memory device comes in various forms. One example of a non-volatile memory device is a magnetic disk, as can be found in many computer hard drives. Another example is an optical disk such as a CD-R/W. Yet another example is a solid state memory circuit such as an electrically erasable and programmable read-only memory (EEPROM), a specific example of which is a flash memory device. A flash memory device utilizes high voltages to erase a block of memory cells in one operation, allowing these cells to then be reprogrammed with new data. By virtue of their robustness, convenience and low cost, solid state memory devices, particularly flash memory devices, have gained immense popularity in the marketplace and are expected to become even more dominant as the demand for non-volatile memory continues to grow unabated.

In certain non-volatile memory systems, data and control signals are transferred between the controller and memory devices in parallel using a parallel bus (this configuration is sometimes referred to as "multi-drop"). There are several disadvantages associated with transferring data and control signals between a controller and a memory device utilizing a parallel bus. One disadvantage relates to the complexity involved in implementing such a system. For example, the number of connections needed to implement the parallel bus may be quite significant and require the use of multi-layered printed circuit boards (PCBs). Another disadvantage relates to signal quality in the memory system. For example, parallel buses tend to be susceptible to crosstalk, signal skew, signal attenuation and noise, which may affect the quality of the signals carried by the connections. Yet another disadvantage associated with many parallel bus designs relates to power consumption. Parallel buses tend to require a significant amount of power in order to drive the signals on the bus.

To address shortcomings associated with parallel buses, some memory systems incorporate serial bus designs for transferring data and control signals between the controller and the memory devices. Serial bus designs tend to utilize fewer connections and thus are not as complex and as susceptible to problems associated with parallel bus designs.

SUMMARY

According to a first aspect, there is provided a semiconductor memory device including a memory and a plurality of inputs for receiving from a previous device a command latch enable signal, an address latch enable signal and an information signal. A device identification register stores register bits that distinguish the memory device from other possible memory devices. Circuitry for comparing identification bits in the information signal with the register bits provides positive or negative indication as to whether the identification bits match the register bits. If the indication is positive, then the memory device is configured to respond as having been selected by a controller. If the indication is negative, then the memory device is configured to respond as having not been selected by the controller. A plurality of outputs release a set of output signals towards a next device. Control circuitry is configured to interpret, when the indication is positive, the information signal based on the command latch enable signal and the address latch enable signal. Bypass circuitry is configured to transfer, when the indication is negative, the command latch enable signal, the address latch enable signal and the information signal to the outputs of the memory device.

According to a second aspect, there is provided a method that includes storing register bits in a memory device. The register bits distinguish the memory device from other possible memory devices. The method also includes receiving a command latch enable signal, an address latch enable signal and an information signal at a memory device. The method also includes comparing identification bits in the information signal with the register bits to provide positive or negative indication as to whether the identification bits match the register bits. The indication is positive when the memory device has been selected by a controller. The indication is negative when the memory device has not been selected by the controller. The method also includes interpreting, when the indication is positive, the information signal based on the command latch enable signal and the address latch enable signal. The method also includes transferring, when the indication is negative, the command latch enable signal, the address latch enable signal and the information signal to a neighboring device.

BRIEF DESCRIPTION OF THE DRAWINGS

FIG. 2 is a table showing a command structure of a plurality of commands that can be issued by the controller and interpreted by the memory devices of FIG. 1, in accordance with an example non-limiting embodiment.

DETAILED DESCRIPTION

"#" as used herein means complement. As an example, CE# is the complement of CE. ECC, DLL and PLL are examples of acronyms found herein that are known to those skilled in the art. ECC as used herein is an acronym for Error Correcting Code. DLL as used herein is an acronym for Delay Locked Loop. PLL as used herein is an acronym for Phase Locked Loop.

Figure 1:
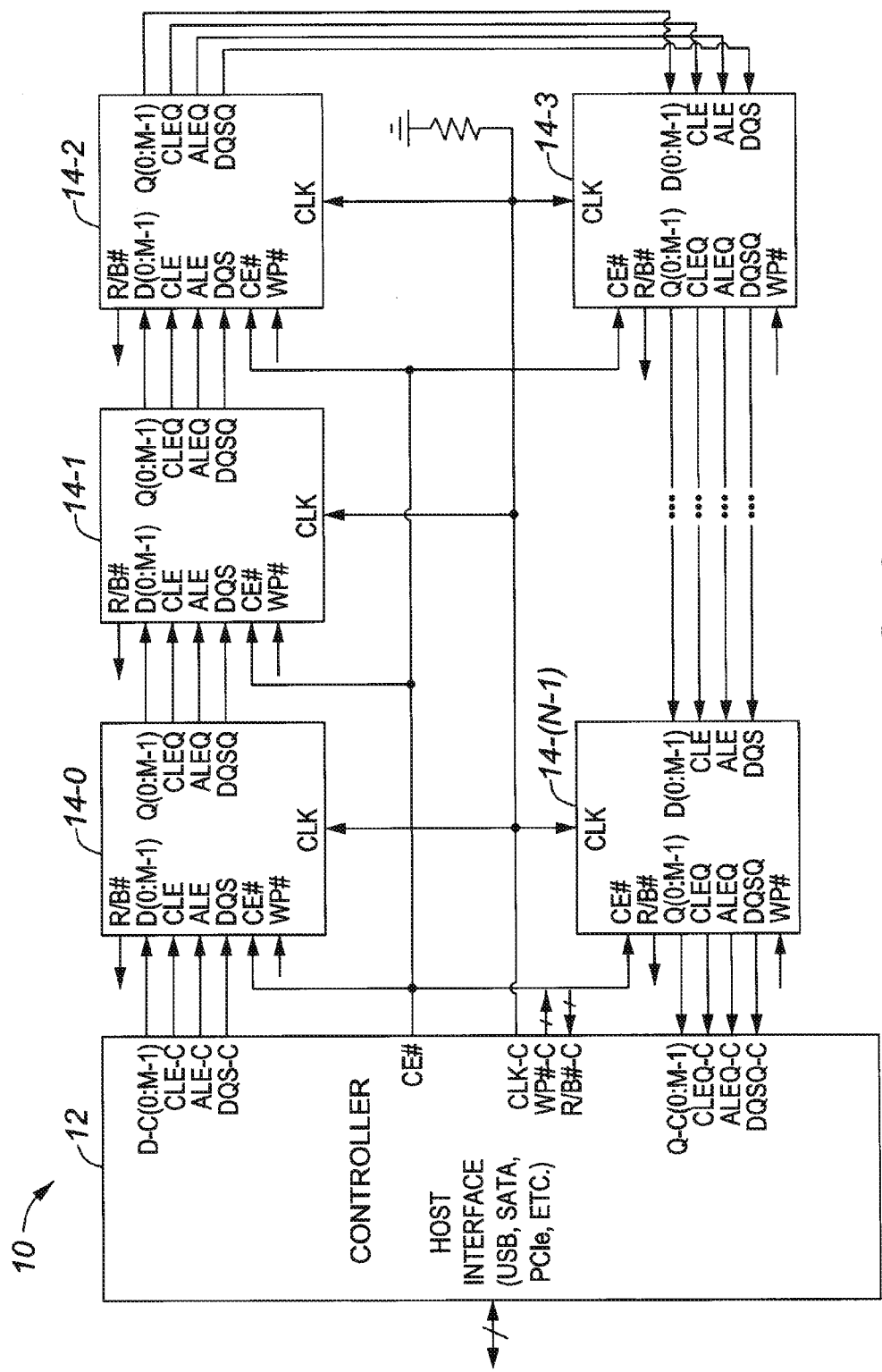
FIG. 1 is a block diagram of a plurality of memory devices connected to a controller in a point-to-point ring topology, in accordance with an example non-limiting embodiment.

FIG. 1 shows an example memory system 10 including a controller 12 in communication with a plurality of semiconductor memory devices 14-0, 14-1, . . . , 14-(N−1) arranged in a point-to-point ring topology. Specifically, the controller 12 is connected to memory device 14-0, which is connected to memory device 14-1, which is connected to memory device 14-2, and so on. Finally, memory device 14-(N−1) is connected back to the controller 12. In non-limiting example embodiments, the controller 12 and the memory devices 14-0, 14-1, . . . , 14-(N−1) may be implemented in a single multi-chip package (MCP) or as discrete units.

It should be appreciated that the system 10 may include any number of memory devices 14-0, 14-1, . . . , 14-(N−1). It should also be appreciated that different types of memory devices can be utilized as long as they have compatible interfaces. For example, the memory devices 14-0, 14-1, . . . , 14-(N−1) may all be of the same type (e.g., all having NAND Flash memory core), or they may be of different types (e.g., some having NAND Flash memory core and others having NOR Flash memory core).

Other suitable possibilities will occur to those of skill in the art as being within the scope of example embodiments. Also, it should be appreciated that the memory devices 14-0, 14-1, . . . , 14-(N−1) may, in some examples, be at least substantially compliant with the flash standard described in "Open NAND Flash Interface Specification", Revision 2.2, Oct. 7, 2009, the contents of which are herein incorporated by reference.

The memory system 10 operates in a clock synchronous manner with respect to a device-external clock signal which may be distributed from the controller 12 in a number of ways, including in a multi-drop fashion, which is shown in FIG. 1 as a connection between a CLK-C output of the controller 12 to individual CLK inputs on the various memory devices 14-0, 14-1, . . . , 14-(N−1).

In addition, an address latch enable signal is daisy-chained from an ALE-C output of the controller 12 to an ALE input of memory device 14-0, then from an ALEQ output of memory device 14-0 to an ALE input of memory device 14-1, etc., and finally from an ALEQ output of memory device 14-(N−1) to an ALEQ-C input of the controller 12. Similarly, a command latch enable signal is daisy-chained from a CLE-C output of the controller 12 to a CLE input of memory device 14-0, then from a CLEQ output of memory device 14-0 to a CLE input of memory device 14-1, etc., and finally from a CLEQ output of memory device 14-(N−1) to a CLEQ-C input of the controller 12. Similarly, a data strobe signal (DQS) is daisy-chained from a DQS-C output of the controller 12 to a DQS input of memory device 14-0, then from a DQSQ output of memory device 14-0 to a DQS input of memory device 14-1, etc., and finally from a DQSQ output of memory device 14-(N−1) to a DQSQ-C input of the controller 12. The following are synchronized with rising and/or falling edges of the device-external clock signal issued via the CLK-C output of the controller 12: i) the address latch enable signal; ii) the command latch enable signal; and iii) the DQS signal.

In addition, a synchronous M-bit wide data bus is daisy-chained from a set of D-C[0:M−1] outputs of the controller 12 to a respective set of D[0:M−1] inputs of memory device 14-0, then from a respective set of Q[0:M−1] outputs of memory device 14-0 to a respective set of D[0:M−1] inputs of memory device 14-1, etc., and finally from a set of Q[0:M−1] outputs of memory device 14-(N−1) to a respective set of Q-C[0:M−1] inputs of the controller 12. In various embodiments, M may be 1, 2, 4, 8, 16 or some other suitable value.

The data bus carries an information signal which, at different points in time, may convey command information, address information or data information. Whether the information signal conveys command information, address information or data information at a particular point in time is a function of the address latch enable signal and the command latch enable signal referred to above. This relationship will be described in further detail later on.

The controller 12 may also provide hardware write protection via a set of WP#-C outputs on the controller 12, each of which is connected to a respective WP# input on each of the memory devices 14-0, 14-1, . . . , 14-(N−1). The controller 12 may also enable device status monitoring via a set of R/B#-C inputs on the controller 12, each of which is connected to a respective R/B# output on each of the memory devices 14-0, 14-1, . . . , 14-(N−1). Of course, the controller 12 and the memory devices 14-0, 14-1, . . . , 14-(N−1) may include additional inputs and outputs for purposes such as power supply, connection to ground, etc., and which need not be described in detail because they are assumed to be known and understood by persons skilled in the art.

Generally speaking, the controller 12 comprises control logic/circuitry that is configured to issue command information, address information and data information to individual memory devices in the point-to-point ring topology. An individual memory device to which the controller 12 issues command information, address information or data information at a particular point in time can be referred to as a "target" device.

In accordance with some example embodiments, a "target" device is distinguished from a device that is not a "target" as follows. The memory device 14-0 includes a Device ID register and comparator block 307 (FIG. 3) that generates unique ID numbers for each device (usually done at the power-up initialization procedure). In normal operation, the ID comparator (for example, circuitry for comparing) compares the device ID input byte with the register byte, and then decides whether it is matching or not. If it is not matching, the incoming input bytes are to be bypassed through the echo pins.

Returning now to the discussion of the controller 12, in order to issue specific information (which can be command information, address information or data information) to the target device, the controller 12 encodes the specific information into the information signal placed on the D-C[0:M−1] outputs and, additionally, controls the latch enable signals on the CLE-C and ALE-C outputs in order to signal the presence of the specific information on the D-C[0:M−1] outputs. The specific manner of controlling the latch enable signals is now described.

In order to ensure effective communication among the devices in the system 10, the controller 12 and the memory devices 14-0, 14-1, . . . , 14-(N−1) abide by a communication protocol. According to the communication protocol, the controller 12 controls the latch enable signals on the CLE-C and ALE-C outputs in order to communicate with the memory devices 14-0, 14-1, . . . , 14-(N−1). Specifically, the controller 12 issues commands that have a certain command structure, shown in FIG. 2. In what follows, it is assumed that the target memory device has its CE# input set to LOW. Also, it will be understood that in some example embodiments there will be no chip enable pins (e.g. no CE# or CE pins). As will be understood by those skilled in the art, there need not necessarily be a dedicated pin to disable or enable a chip, and that there are various known manners for implementing disabling/enabling control for a chip without dedicated pin(s).

It will be observed that some commands, such as RESET and READ STATUS, use one cycle of the data bus, while other commands, such as PAGE READ, BLOCK ERASE and PAGE PROGRAM, use more than one cycle. The controller 12 encodes the relevant command information into the information signal placed on the D-C[0:M−1] outputs, which are connected to the D[0:M−1] inputs of memory device 14-0. In order to identify the information signal on the D-C[0:M−1] outputs as command information, the controller 12 asserts the command latch enable signal issued via the CLE-C output (e.g., causes it to go HIGH) and de-asserts the address latch enable signal issued via the ALE-C output (e.g., causes it to go LOW). This is done in a synchronism with edges of the device-external clock signal issued via the CLK-C output.

It will also be observed that other commands, such as BLOCK ERASE, PAGE READ and PAGE PROGRAM, require at least one address cycle to follow a previous command cycle. Among the commands requiring addressing, some commands (such as PAGE READ and PAGE PROGRAM) use five address cycles, namely two cycles for the column address and three cycles for the row address. Other commands requiring addressing (such as BLOCK ERASE) use the aforementioned three address cycles for the row address but do not provide a column address. The controller 12 encodes the relevant address information into the information signal placed on the D-C[0:M−1] outputs, which are connected to the D[0:M−1] inputs of memory device 14-0. In order to identify the information signal on the D-C[0:M−1] outputs as address information, the controller 12 de-asserts the command latch enable signal issued via the CLE-C output (e.g., causes it to go LOW) and asserts the address latch enable signal issued via the ALE-C output (e.g., causes it to go HIGH). This is done in a synchronism with edges of the device-external clock signal issued via the CLK-C output.

It will also be observed that still other commands, such as PAGE PROGRAM, require the transmittal of data words to the target memory device following a previous command cycle. Accordingly, the controller 12 encodes the appropriate data information into the information signal placed on the D-C[0:M−1] outputs, which are connected to the D[0:M−1] inputs of memory device 14-0. In order to identify the information signal on the D-C[0:M−1] outputs as data information, the controller 12 asserts both the command latch enable signal issued via the CLE-C output and the address latch enable signal issued via the ALE-C output (causes them to go HIGH). This is done in a synchronism with edges of the device-external clock signal issued via the CLK-C output.

Finally, it will be observed that some commands, such as PAGE READ, include a prompt to elicit read data without any concern for the information signal provided on the D-C[0:M−1] outputs. The prompt is expected to follow a previous command cycle after a delay that corresponds to an amount of time required by the target device to extract the read data from memory. In order to issue the prompt to elicit read data, the controller 12 asserts both the command latch enable signal issued via the CLE-C output and the address latch enable signal issued via the ALE-C output (e.g., causes them to go HIGH). This is done in a synchronism with edges of the device-external clock signal issued via the CLK-C output, following the aforesaid amount of time required by the target device to extract the read data from memory.

It is noted from the above that asserting both the command latch enable signal (issued via the CLE-C output) and the address latch enable signal (issued via the ALE-C output) can have a different significance, depending on whether the command issued by the controller 12 was a PAGE PROGRAM command or a PAGE READ command. Specifically, if the command issued by the controller 12 was a PAGE PROGRAM command, then asserting the latch enable signals indicates the presence of write data on the D[0:M−1] inputs, while if the command issued by the controller 12 was a PAGE READ command, then the asserting the latch enable signals indicates a prompt to elicit read data from memory device 14-0.

It should be noted that some example embodiments include DQS, DQSQ signals and associated functionality. DQS is a data strobe signal providing synchronous reference for data input. DQSQ (or echo of DQS) is a data strobe providing synchronous reference for data output. Also, DQS# and DQSQ# (differential signaling) is optionally contemplated for some example embodiments.

Optionally, to assist the memory devices 14-0, 14-1, . . . , 14-(N−1) in discriminating between write data and a prompt to elicit read data, the controller 12 may provide a set of optional RE#-C outputs (not shown), each of which is connected to a respective RE# input (not shown) on each of the memory devices 14-0, 14-1, . . . , 14-(N−1). The RE#-C outputs convey a plurality of mode signals individually destined for the memory devices 14-0, 14-1, . . . , 14-(N−1). For example, setting the mode signal provided to memory device 14-0 to LOW could be used to request that memory device 14-0 go into a "write mode", whereby upon recognizing that the latch enable signals have been asserted, memory device 14-0 will be alerted to the presence of write data on the D[0:M−1] inputs. Conversely, setting the mode signal provided to memory device 14-0 to HIGH could be used to request that memory device 14-0 go into a "read mode", whereby upon recognizing that the latch enable signals have been asserted, memory device 14-0 will establish that it has received a prompt to elicit read data from the memory cell array 302.

Consider now the case where, in operation, the controller 12 has indeed issued specific information (which can be command information, address information or data information) to a target device in accordance with the communication protocol described above. It will be recalled that the controller 12 will have encoded the specific information into the information signal placed on the D-C[0:M−1] outputs and, additionally, will have appropriately controlled the latch enable signals on the CLE-C and ALE-C outputs in order to signal the presence of the specific information on the D-C[0:M−1] outputs.

The information signal on the D-C[0:M−1] outputs and the latch enable signals on the CLE-C and ALE-C outputs travel to memory device 14-0. However, while memory device 14-0 may in some cases be the target device, in other cases it will not be the target device. Indeed, the behavior of memory device 14-0 is fundamentally different, depending on whether or not it was selected by the controller 12 as the target memory device. This behavioral difference will be described in greater detail after first describing the configuration of memory device 14-0, which is representative of any of the memory devices 14-0, 14-1, . . . , 14-(N−1) in the system 10.

Figure 3:
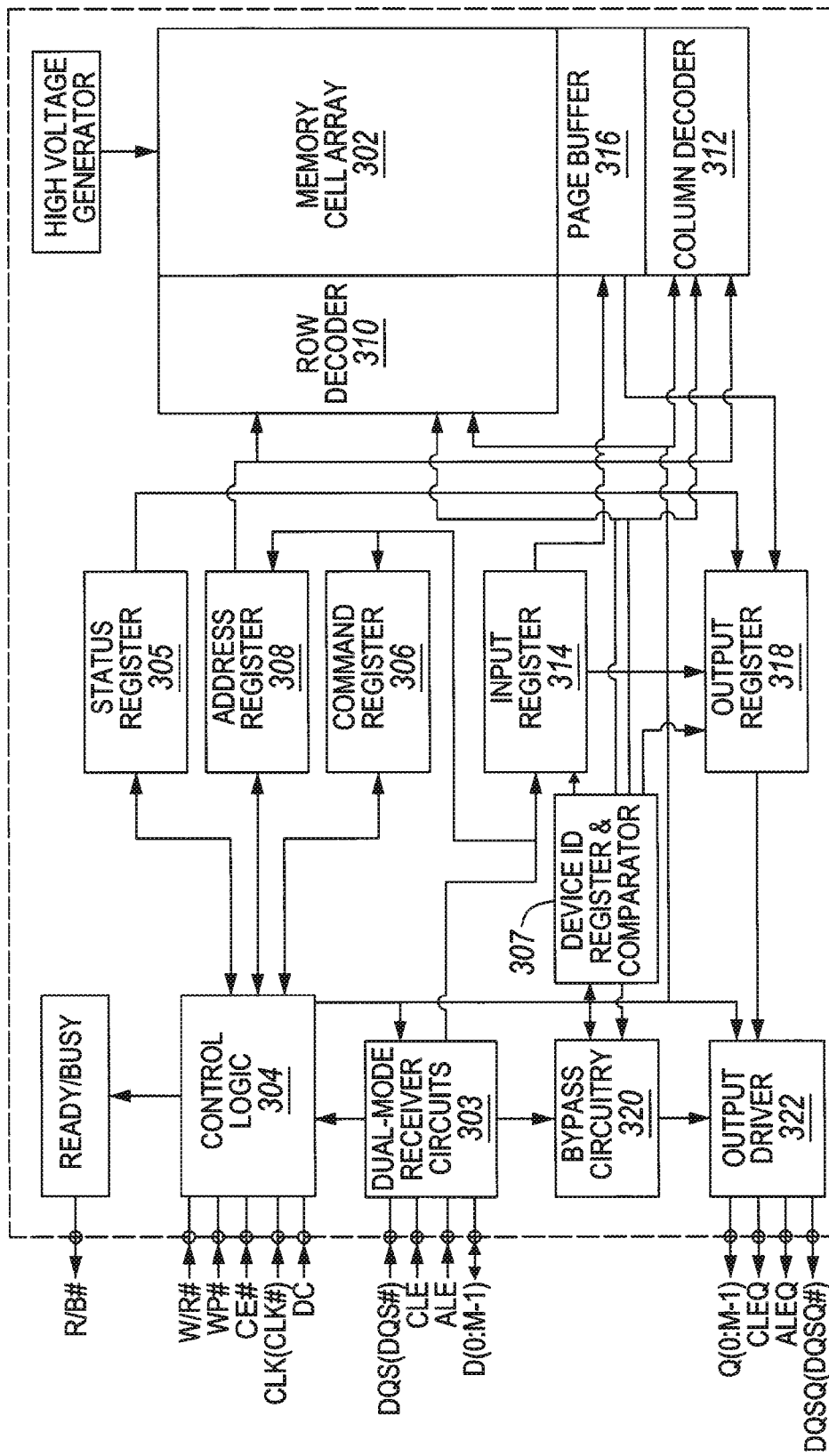
FIG. 3 is a functional block diagram of one of the memory devices in FIG. 1, in accordance with an example non-limiting embodiment.

With additional reference to FIG. 3, memory device 14-0 comprises a memory core, which can comprise a memory cell array 302. In a specific non-limiting embodiment, the memory cell array 302 is arranged into two planes, each plane consisting of 2,048 blocks. Also in a specific non-limiting embodiment, each block is subdivided into 64 programmable pages. Also in a specific non-limiting embodiment, each page consists of 2,112 bytes. Also in a specific non-limiting embodiment, the pages are further divided into a 2,048-byte data storage region with a separate 64-byte area, with the 64-byte area being used for error management functions as commonly known in the art. The memory cell array 302 can be programmed and read on a per-page basis and is erased on a per-block basis. Also, it should be noted that although the memory cell array 302 is shown to be implemented as a single memory bank, in some example embodiments it is contemplated that a memory device may have a plurality (i.e. more than one) memory bank.

Memory device 14-0 comprises input receiver circuits 303 for receiving the information signal on the D[0:M−1] inputs.

Memory device 14-0 also comprises a status register 305 for reporting the operational status of memory device 14-0.

Memory device 14-0 further comprises control logic/circuitry 304, which controls and manages overall operation of memory device 14-0 according to a control algorithm. The control algorithm is sensitive to whether the signal at the CE# input is LOW or HIGH, namely, whether or not memory device 14-0 is enabled at a given point in time.

Indeed, when the signal at the CE# input is LOW, then the control logic 304 is configured to enable the following behavior:

If the command latch enable signal on the CLE input is asserted (for example, set to HIGH for two clock cycles: one for Device-ID, and one for command) and the address latch enable signal on the ALE input is de-asserted (e.g., set to LOW), then information on the D[0:M−1] inputs is captured by the input receiver circuits 303, latched by a command register 306 and transferred to the control logic 304. The control logic 304 considers the information as command information and generates internal signals to control device operations. During this time, the signals on the CLEQ and ALEQ outputs are de-asserted (e.g., set to LOW), while the previous state of the signal on the Q[0:M−1] outputs is preserved. Also, in accordance with a multi-bank embodiment, the command byte includes a bank address. For example, "00h" could identify bank 0 associated with a page read, whereas "02h" could identify bank 2 associated with a page read.

If the command latch enable signal on the CLE input is de-asserted (e.g., set to LOW) and the address latch enable signal on the ALE input is asserted (e.g., set to HIGH)—for the case where certain specific command cycles have been previously received (and the device has been identified as the "target") then information on the D[0:M−1] inputs is captured by the input receiver circuits 303 and latched by an address register 308. The control logic 304 considers the information as address information and sends it to a row decoder 310 or a column decoder 312 to select, respectively, a row address or a column address for the memory cell array 302. During this time, the signals on the CLEQ and ALEQ outputs are de-asserted (e.g., set to LOW), while the previous state of the signal on the Q[0:M−1] outputs is preserved.

If the command latch enable signal on the CLE input is asserted and the address latch enable signal on the ALE input is also asserted, for certain commands, then in accordance with an example embodiment the following two possibilities exist:

a) If memory device 14-0 (identified by device ID as the "target" device) is in write mode, then W/R# is going to be HIGH, and then information on the D[0:M−1] inputs is captured by the input receiver circuits 303 and latched by an input register 314. This information is transferred to the memory cell array 302, on a per-2,112-byte page basis, through a page buffer 316. During this time, the signals on the CLEQ and ALEQ outputs are de-asserted (e.g., set to LOW), while the previous state of the signal on the Q[0:M−1] outputs is preserved.

b) If memory device 14-0 (identified by device ID as the "target" device) is in read mode, then W/R# is going to be LOW, and then information is transferred from the memory cell array 302, on a per-page basis, through the page buffer 316 and loaded into an output register 318 for placement on the Q[0:M−1] outputs via an output driver 322. During this time, the asserted (e.g., HIGH) state of the latch enable signals at the CLE and ALE inputs is echoed on the CLEQ and ALEQ outputs. The signals on the CLEQ, ALEQ and Q[0:M−1] outputs are referenced to the edges of a device-internal clock signal. In some non-limiting embodiments, a clock recovery circuit (not shown) may be used for deriving the device-internal clock signal from the device-external clock signal (at the CLK input). The clock recovery circuit, if used, may include circuit components in a feedback loop configuration, such as a phase locked loop or a delay locked loop.

Turning now to the case where memory device 14-0 is not the target device, in such case the control logic 304 is configured to enable "bypass" (or "flow-through") behavior. Specifically, bypass circuitry 320 is operative to transfer the command latch enable signal on the CLE input over to the CLEQ output. The bypass circuitry 320 is also configured to transfer the address latch enable signal on the ALE input over to the ALEQ output. Finally, the bypass circuitry 320 is configured to transfer the information captured by the input receiver circuits 303 from the D[0:M−1] inputs over to the Q[0:M−1] outputs. Memory device thus bypasses (or "flows through" or "echoes") any incoming signal transitions from the D[0:M−1] input, DQS input, the ALE input and the CLE input over to the Q[0:M−1] outputs, DQSQ output, the ALEQ output and CLEQ output, respectively. Bypass circuitry 320 bypasses input signals (D[0:7], CLE, ALE, DQS) to output signals (Q[0:7], CLEQ, ALEQ, DQSQ) in synchronous manner with SDR (for command & address latch cycles) or DDR mode (for data in/out cycles). Since the command and address cycles are relatively shorter than data in/out cycles (most NAND flash memories have 4K~8K bytes long data) and they contain the most important and critical information (device ID, command & address info), SDR operation may optionally be implemented instead of DDR operation to reduce probability of bit errors.

After command and address information is received at the "target" memory device, command and address cycles may subsequently be bypassed all the way back to the host controller, and the controller may have option for double checking the returning bytes for more accuracy. For data in/out transitions, the selected device by ID may optionally not bypass the write data input packets (for the purpose of power savings).

The bypass, flow-through or echo operation is done in a source-synchronous manner relative to the aforementioned device-internal clock signal (which, optionally, may be obtained from the clock recovery circuit in some embodiments), with a predetermined delay in number of clock cycle(s), referred to as a "flow-through latency" or "input-to-output latency" and denoted $t_{IOL}$. The synchronous relationship of the signals at the outputs ensures proper set-up and hold time at the next neighboring device in the system 10.

It should thus be appreciated that if the target memory device is 14-T, then all memory devices 14-x where x<T will echo the signals received from the controller 12, while all memory devices 14-x with x>T will echo the signals received from the target memory device 14-T. For its part, the target memory device 14-T will respond to the information received from the controller 12 via memory devices 14-x (for x<T) in the manner described above. It should be appreciated that each memory device introduces additional clock cycle latency along the point-to-point ring. Therefore, the number of interconnected devices determines the total input-to-output latency of operations. This can assist the controller 12 in determining the start and end of valid read data on the Q-C[0:M−1] inputs received from memory device 14-(N−1). However, by connecting the CLEQ and ALEQ outputs of memory device 14-(N−1) to the CLEQ-C and ALEQ-C inputs of the controller 12, the controller 12 is provided with more precise knowledge of the start and end of valid read data on the Q-C[0:M−1] inputs without counting the clock latency according to the number of devices in the system 10.

It also should be appreciated that by virtue of synchronizing the signals on the Q[0:M−1] outputs of each memory device with the transitions of the respective device-internal clock signal derived from the respective device-external cock signal at the respective CLK input, the memory system 10 can provide SDR (Single Data Rate), DDR (Double Data Rate) or QDR (Quadruple Data Rate) operation in various non-limiting embodiments. This could make flow-through latency as small as a half clock cycle or a quarter clock cycle, for example. In addition, the memory system 10 can be implemented using differential clock signals in order to achieve more accurate clock cycle timing in high speed applications. In the same manner, the signals on the ALE, CLE and D[0:M−1] inputs, as well as the ALEQ, CLEQ and Q[0:M−1] outputs, can be differential signals if desired or beneficial.

The following provides a detailed description of specific non-limiting examples of individual commands issued by the controller 12 and the manner in which the target memory device (say 14-3) behaves upon receipt of such commands.

Page Read

Figure 4:
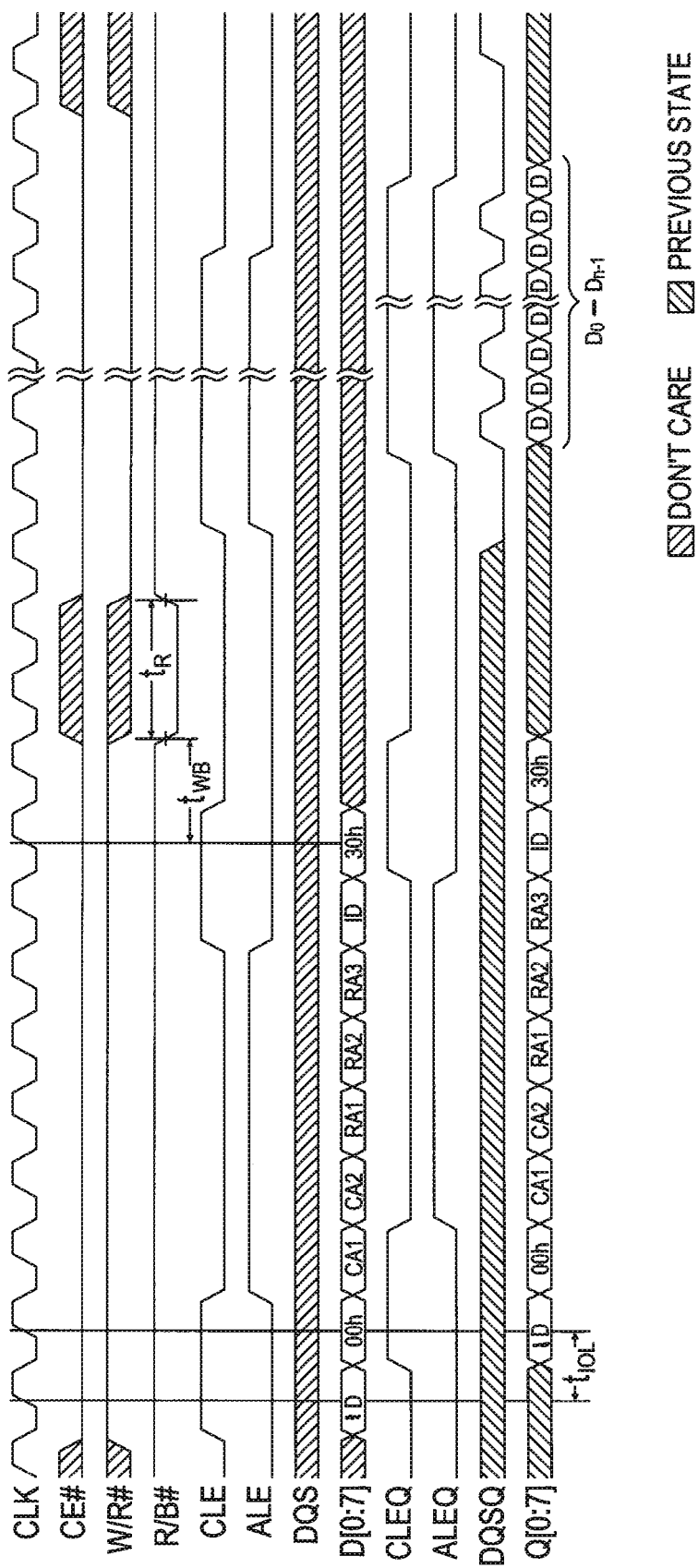
FIG. 4 is a timing diagram illustrative of a PAGE READ command, in accordance with an example non-limiting embodiment.

With reference to FIG. 4, the PAGE READ command includes a first command cycle (in this example: the 00h command code), five address cycles, and a second command cycle (in this example: the 30h command code). The target memory device 14-3 responds by transferring the page of data at the given address in the memory cell array 302 to the page buffer 316 while keeping the signal at the R/B# to LOW for the page read time period, denoted $t_R$. The signal at the R/B# transitions to HIGH after the page transfer is complete.

At this point, data in the page buffer 316 is output by the target memory device 14-3 after receipt of a prompt from the controller 12. Specifically, after the read time period ($t_R$) has elapsed, the controller 12 asserts the command latch enable signal and the address latch enable signal (e.g., sets them to HIGH). In response, the target memory device 14-3 transmits read data through the Q[0:M−1] outputs, and referenced to an edge of the device-internal clock signal derived from the device-external clock signal at the CLK input. The read operation starts from the initial column address and goes to the end of the page, with the column address being automatically increased in the process. In addition, the target memory device 14-3 echoes the command latch enable signal (received at the CLE input) and the address latch enable signal (received at the ALE input) over to the CLEQ and ALEQ outputs.

Figure 5:
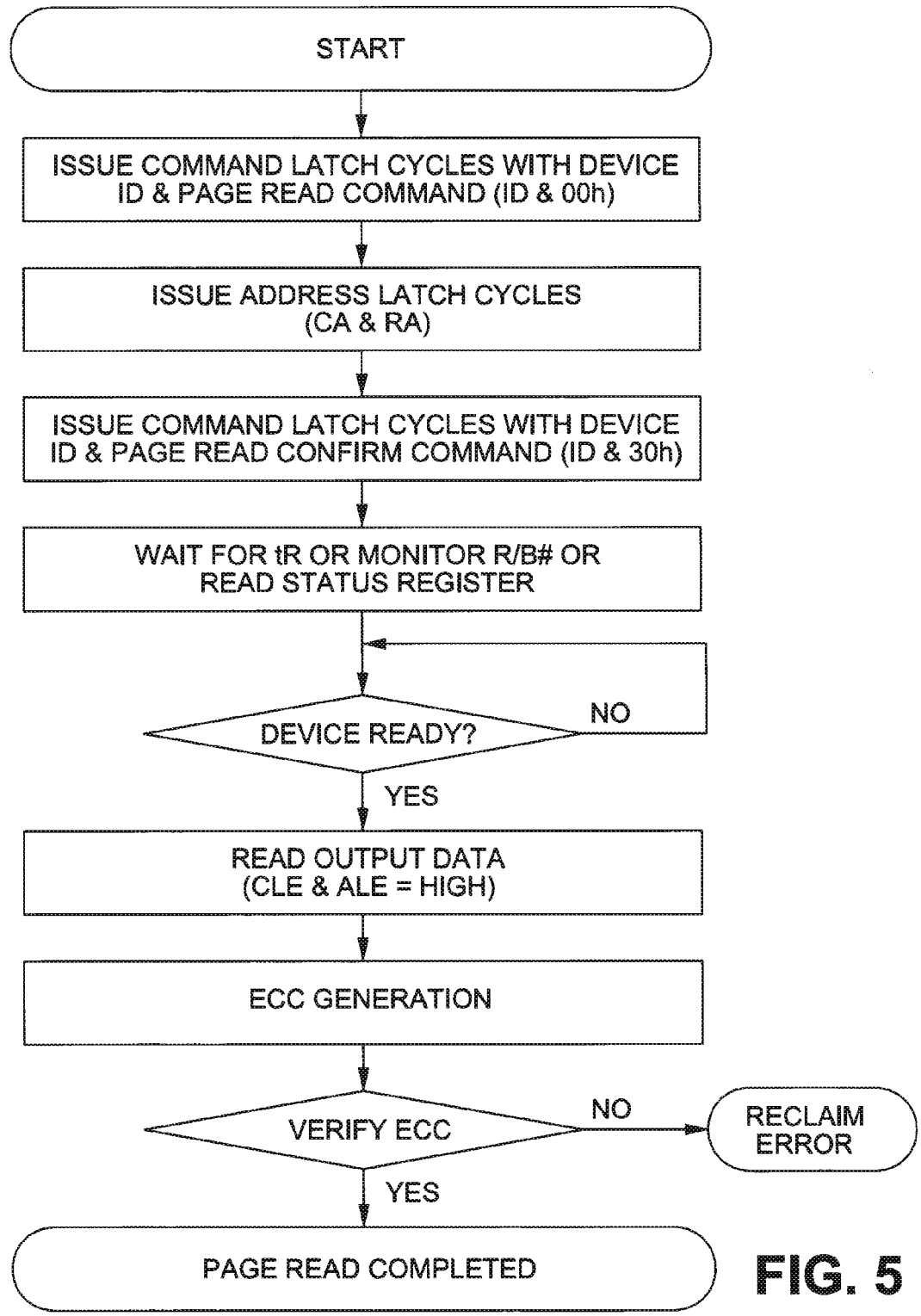
FIG. 5 is a flow chart for a PAGE READ operation, in accordance with an example non-limiting embodiment.

In accordance with an example non-limiting embodiment, FIG. 5 is a flow chart for a PAGE READ operation. Read in conjunction with FIG. 4 and other portions of the present Detailed Description, the flow chart is self-explanatory to a person of ordinary skill in the art.

Random Data Output

The RANDOM DATA OUTPUT command enables the controller 12 to specify a new column address so the data at single or multiple addresses can be read. The RANDOM DATA OUTPUT command is enabled after having executed a PAGE READ command as described above. Data at a desired column address can be elicited by issuing a first command cycle (for example, the 05h command code shown in the Table of FIG. 2), two address cycles specifying the desired column address, and a second command cycle (for example, the E0h command code).

Page Program

Figure 6:
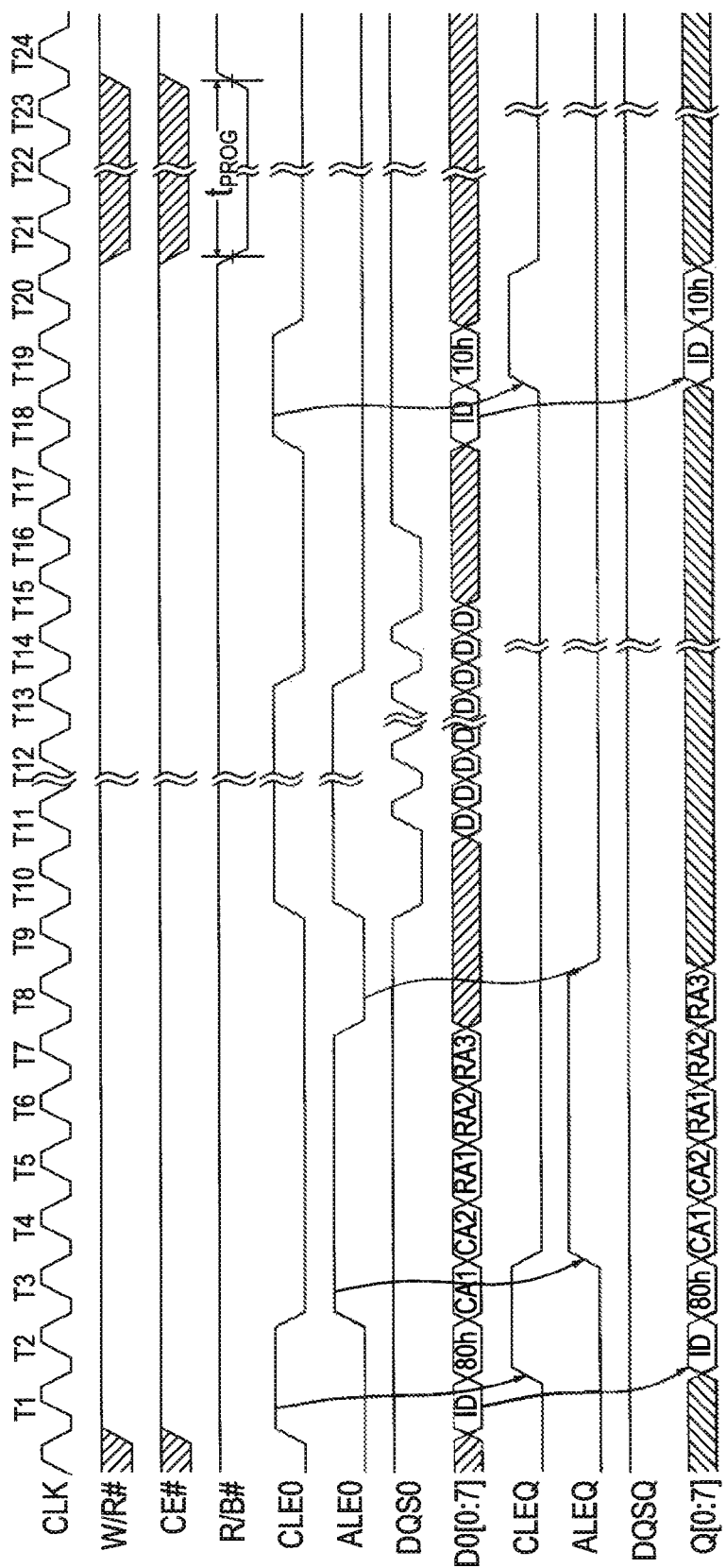
FIG. 6 is a timing diagram illustrative of a PAGE PROGRAM command, in accordance with an example non-limiting embodiment.

With reference to FIG. 6, the PAGE PROGRAM command includes a first command cycle (in this example: the 80h command code), five address cycles (specifying a given address), the data to be written (on consecutive clock cycles starting at the given address), and a second command cycle (in this example: the 10h command code). The second command cycle initiates a non-volatile programming process where the loaded data is programmed into the appropriate cells of the page that starts at the given address. This process lasts for a program time period, denoted $t_{PROG}$. An internal program state controller can automatically execute the algorithms and timings necessary for programming and verification, thereby freeing the controller 12 for other tasks.

Figure 7:
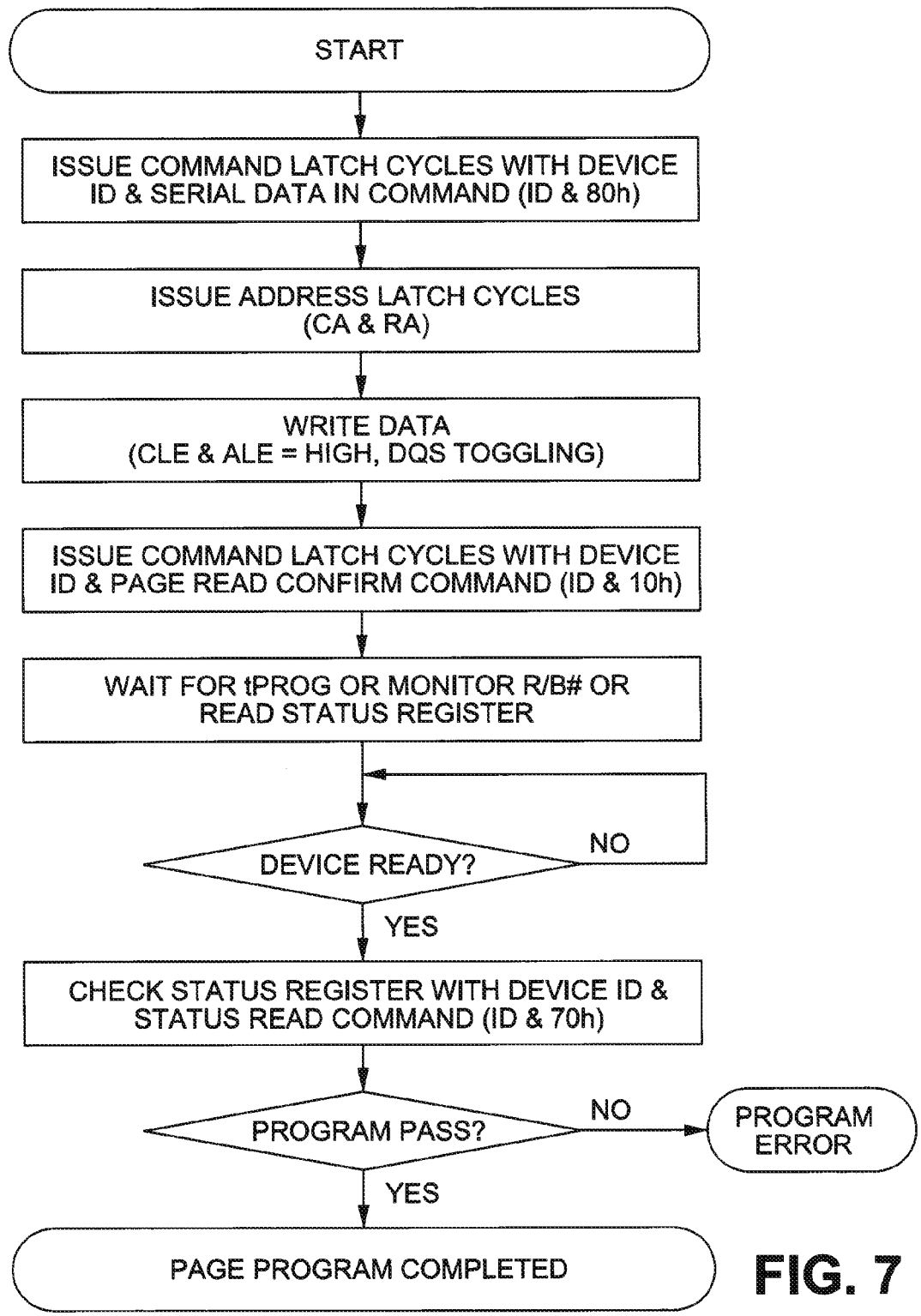
FIG. 7 is a flow chart for a PAGE PROGRAM operation, in accordance with an example non-limiting embodiment.

In accordance with an example non-limiting embodiment, FIG. 7 is a flow chart for a PAGE PROGRAM operation. Read in conjunction with FIG. 6 and other portions of the present Detailed Description, the flow chart is self-explanatory to a person of ordinary skill in the art.

Random Data Input

The RANDOM DATA INPUT command can be issued just prior to issuing the second command cycle of the PAGE PROGRAM command, in order to modify the data to be written to a particular column address. Accordingly, once the data to be written has been entered in the context of a PAGE PROGRAM command as described above, the controller 12 issues a command cycle (for example, the 85h command code shown in the Table of FIG. 2), two address cycles (specifying a given column address) and the data to be written. Following this, the second command cycle of the PAGE PROGRAM command (for example, the 10h command code) can be issued in order to trigger the aforementioned programming operation of duration $t_{PROG}$.

Block Erase

Figure 8:
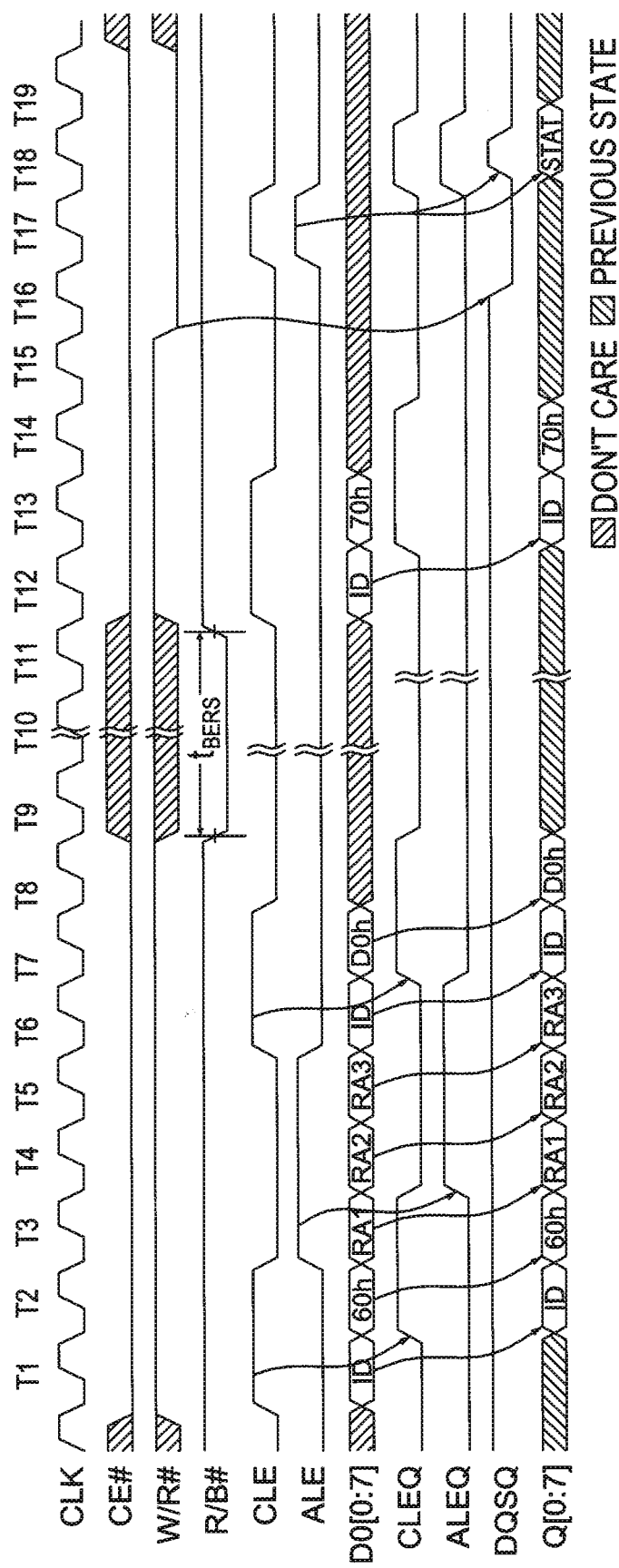
FIG. 8 is a timing diagram illustrative of a BLOCK ERASE command, in accordance with an example non-limiting embodiment.

Erasure of the cells in the memory cell array 302 is done on a per-block basis. With reference to FIG. 8, the BLOCK ERASE command includes a first command cycle (in this example: the 60h command code), three address cycles and a second command cycle (in this example: the D0h command code). It is noted that where there are 4,096 erasable blocks, only twelve (12) bits are required to specify the block needing to be eased. Thus, where more than 12 bits are loaded in the three address cycles, the remaining bits can be ignored. The second command cycle initiates an internal erasing process, which is followed by an internal verification process, lasting for a block erase time period, denoted $t_{BERS}$.

It should be appreciated that the use of a two-step sequence (i.e., first and second command cycles) ensures that memory contents are not accidentally erased due to external noise conditions.

Figure 9:
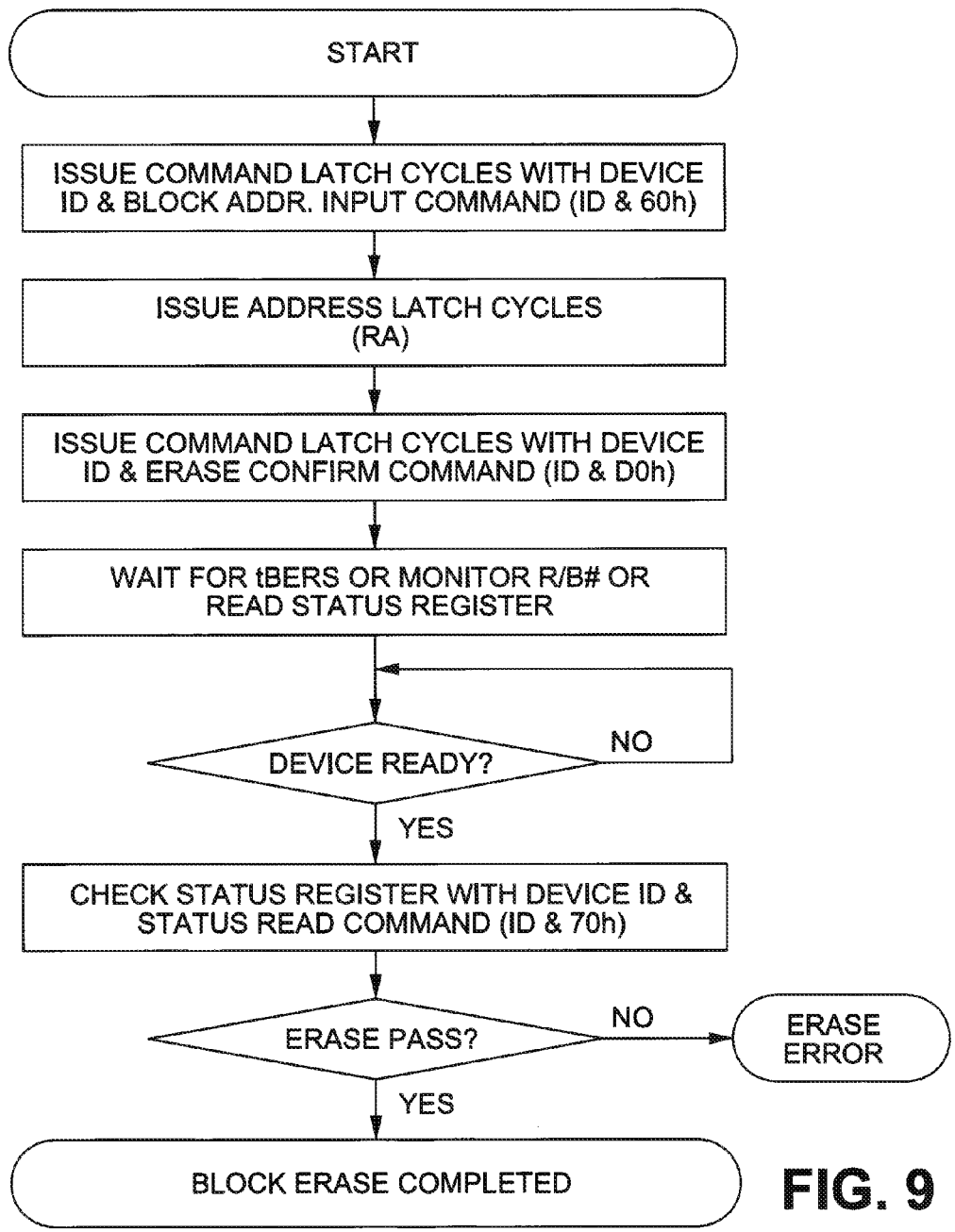
FIG. 9 is a flow chart for a BLOCK ERASE operation, in accordance with an example non-limiting embodiment.

In accordance with an example non-limiting embodiment, FIG. 9 is a flow chart for a BLOCK ERASE operation. Read in conjunction with FIG. 8 and other portions of the present Detailed Description, the flow chart is self-explanatory to a person of ordinary skill in the art.

Reset

Figure 10:
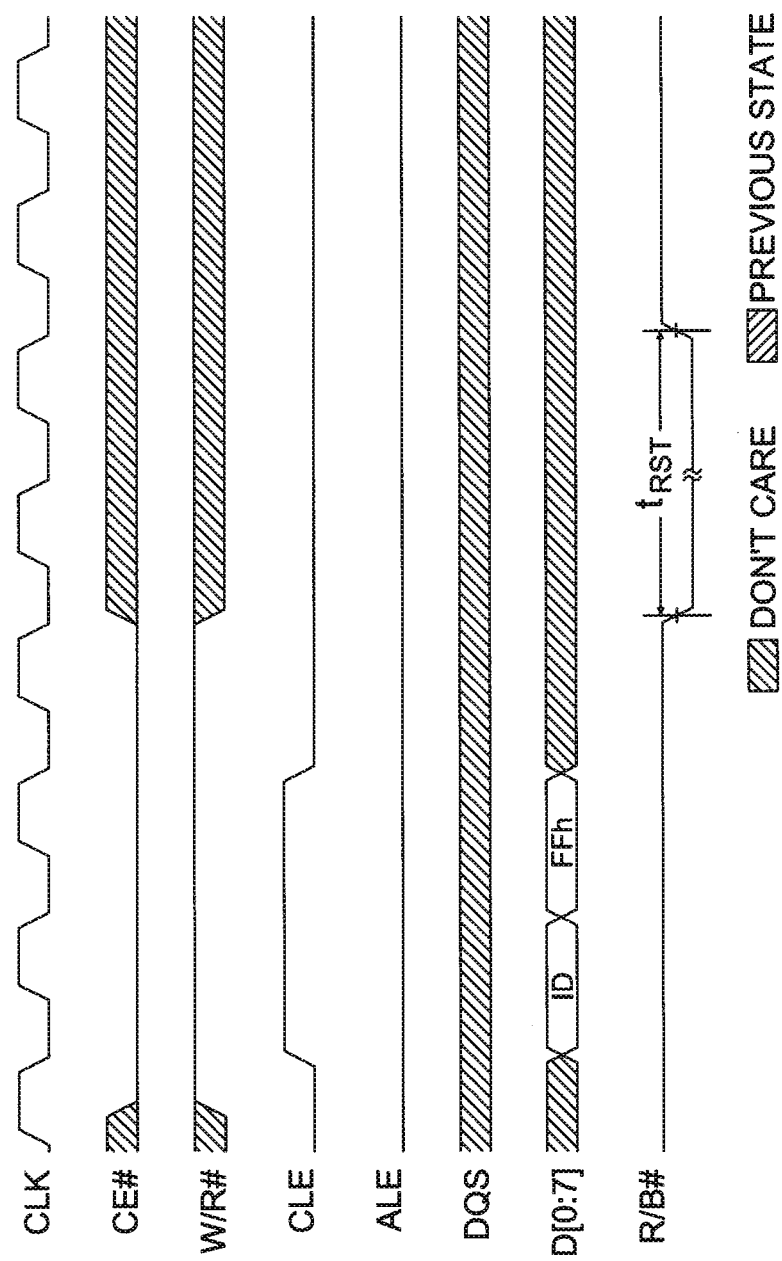
FIG. 10 is a timing diagram illustrative of a RESET command, in accordance with an example non-limiting embodiment.

With reference to FIG. 10, the RESET command includes a single command cycle (in this example: the FFh command code). The RESET command places the target memory device 14-3 into a known condition and to abort a device operation in progress. Specifically, PAGE READ, PAGE PROGRAM, and BLOCK ERASE operations can be aborted while the target memory device 14-3 is busy performing those operations. For example, in the case of a PAGE PROGRAM or BLOCK ERASE operation, the internally generated voltage is discharged to 0 volts and the target memory device 14-3 enters stand-by status waiting for a new command after a specified reset time, denoted $t_{RST}$. The contents of the page location being programmed or the block being erased are no longer valid, as the data will be partially programmed or erased. The command register 306 is cleared and is ready for the next command.

Read Status

Figure 11:
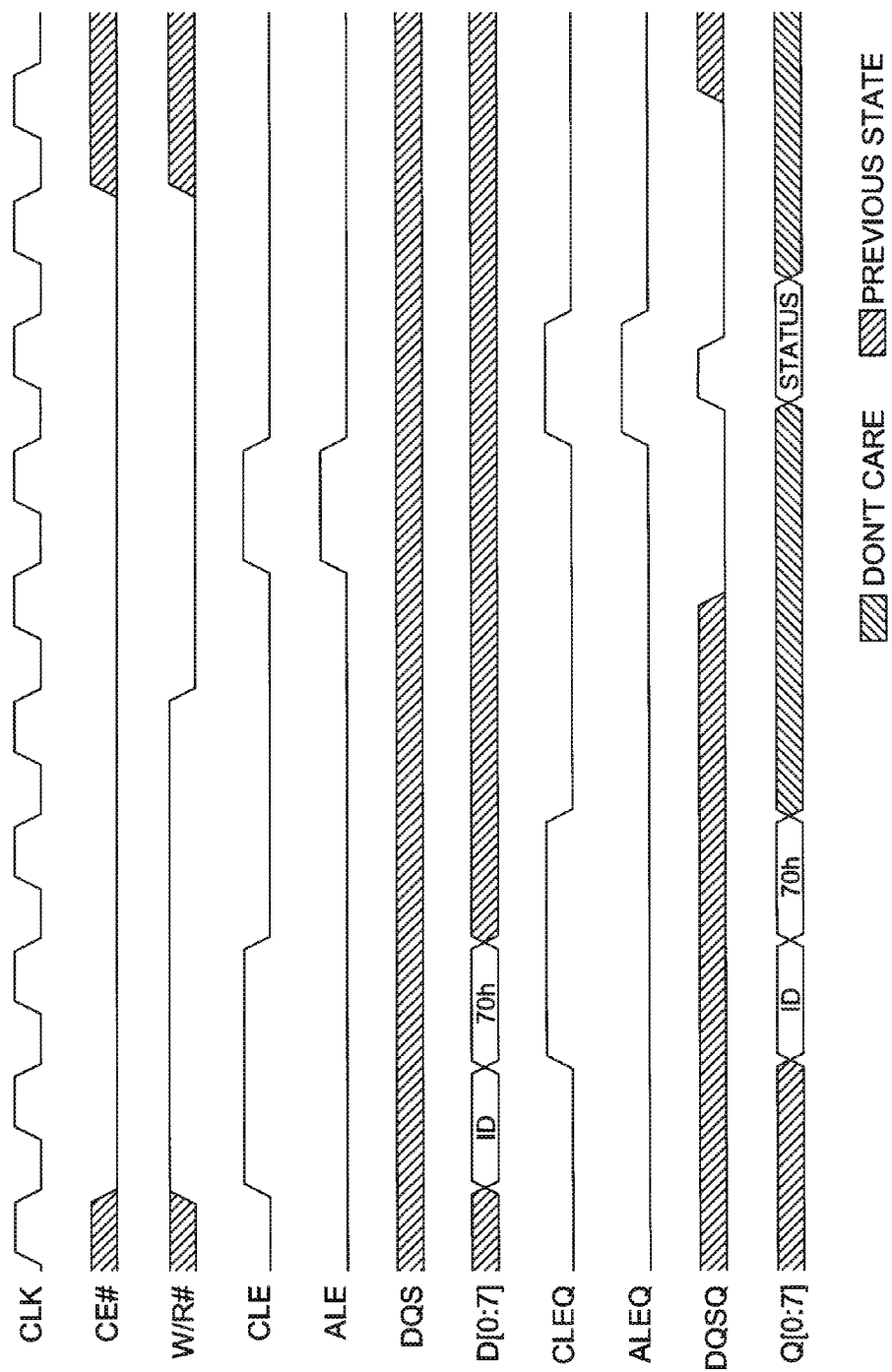
FIG. 11 is a timing diagram illustrative of a READ STATUS command, in accordance with an example non-limiting embodiment.

The status register 305 is readable by the control logic 304 during device operation. With reference to FIG. 11, the READ STATUS command includes a single command cycle (in this example: the 70h command code). After the READ STATUS command is issued, the control logic 304 places the contents of the status register 305 on the Q[0:M−1] outputs until a new valid command is written to the command register 306. Meanwhile, changes in the status register 305 will be reflected on the Q[0:M−1] outputs as long as the command latch enable signal and the address latch enable signal (i.e., at the CLE and ALE inputs, respective) are asserted (e.g., set to HIGH) while the signal at the CE# input is LOW; it is not necessary to start a new READ STATUS cycle to see these changes.

With reference back to FIGS. 3 and 4, the READ STATUS command can be issued to determine the progress of the page transfer from the memory cell array 302 to the page buffer 316 during a PAGE READ command If the controller 12 issues the READ STATUS command before issuing a prompt to elicit the read data (by asserting the latch enable signals), then in order to revert back to the read operation, the controller 12 reissues the second command cycle of the PAGE READ command (in this example: the 00h command code). Subsequently asserting both the command latch enable signal and the address latch enable signal (e.g., setting them to HIGH) will result in data being output by the target memory device 14-3, starting at the initial column address specified earlier in the PAGE READ command.

With reference back to FIG. 6, the READ STATUS command can also be issued to determine the progress of the PAGE PROGRAM command. Alternatively, the controller can monitor the R/B# output of the target memory device 14-3, received via the appropriate R/B#-C input at the controller 12.

With reference back to FIG. 8, the READ STATUS command can also be issued to check the status of the BLOCK ERASE operation.

With reference again to FIG. 10, the READ STATUS command can also be issued to check the status of the RESET command. Alternatively, the controller 12 can wait until the specified reset time $t_{RST}$ has elapsed before resuming normal operation.

Figure 12:
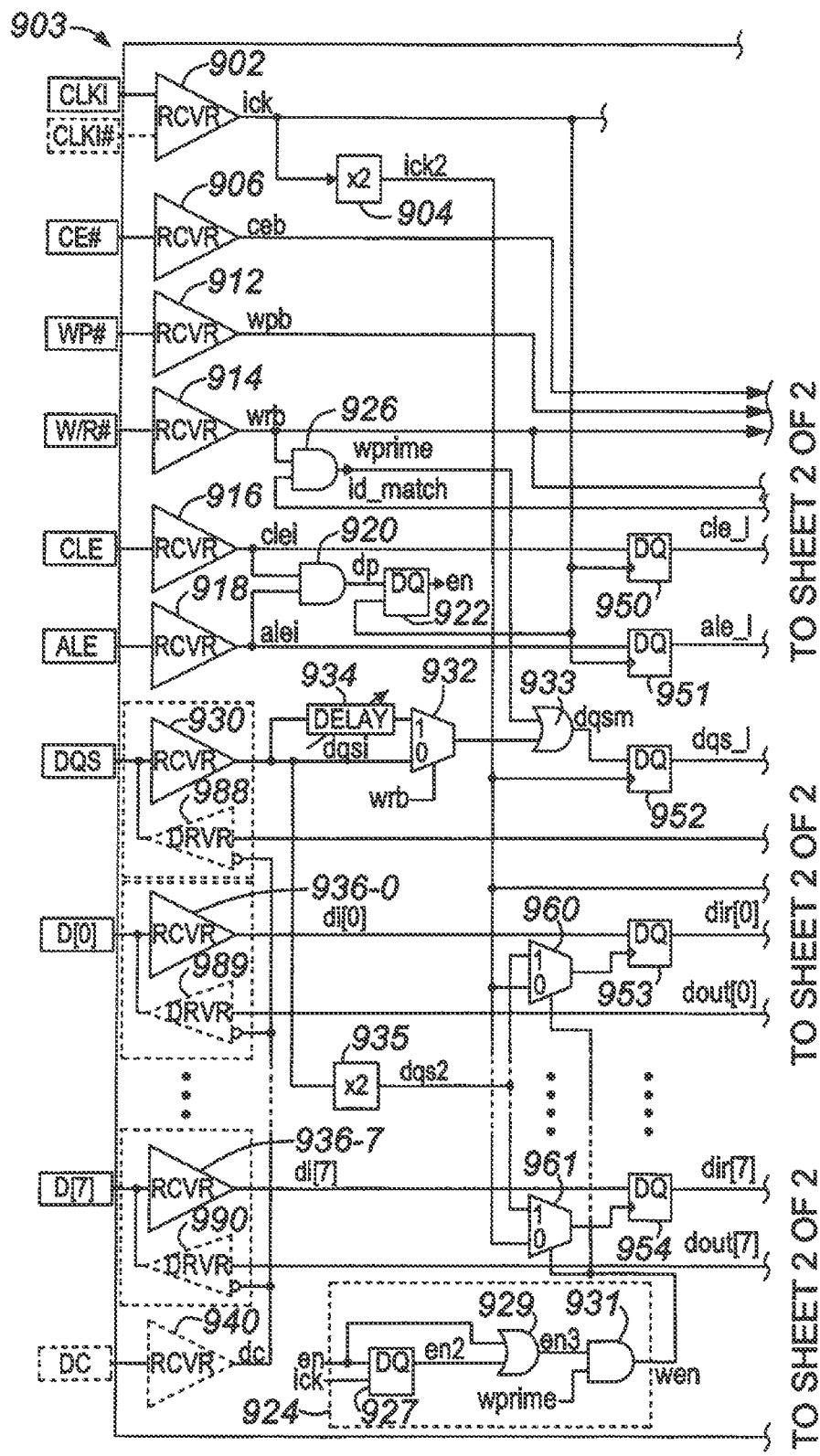
FIG. 12 is a circuit diagram of a memory device in accordance with an example non-limiting embodiment.
Figure 12:
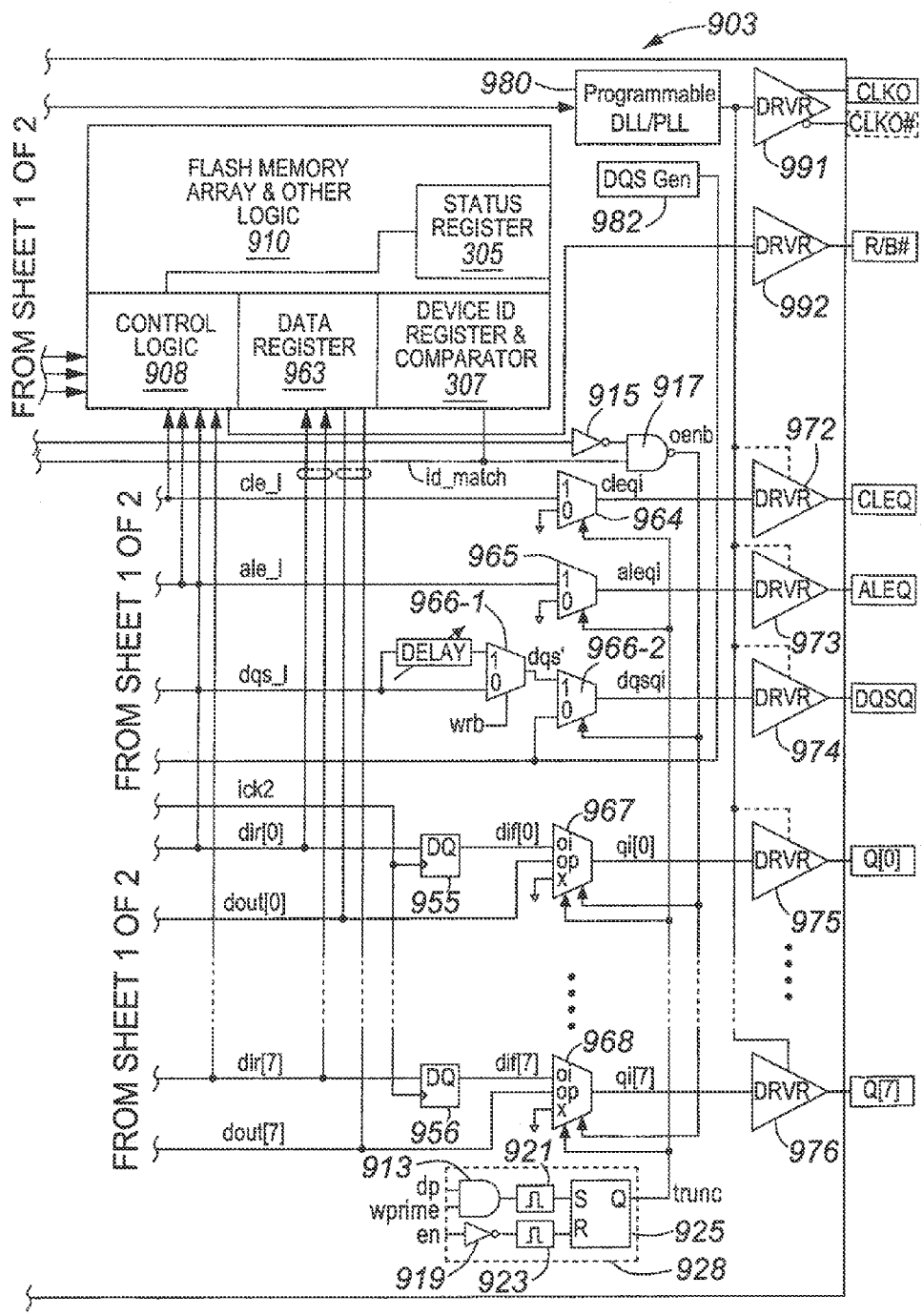

Reference will now be made to FIG. 12 which is a further diagram of the memory device shown in FIG. 3 (mainly the same except for the manner of the clock signal distribution) in order to illustrate further detail of a more specific example embodiment. Starting at the top left corner of the diagram, the CLK signal is received by input receiver buffer 902 (which may optionally be differential to handle both the CLK and CLK# signals). Input receiver buffer 902 translates the external interface level of CLKI to the internal logic level of 'ick', which is used in a number of internal logic blocks for various operations. Also, illustrated memory device 903 includes clock doubling circuitry 904 which is employed to derive 'ick2' having twice the frequency of 'ick'. Details of the clock doubling circuitry 904 will be apparent to one skilled in the art.

Still with reference to the example embodiment illustrated in FIG. 12, input receiver 906 receives the CE# signal and generates an internal signal 'ceb' which is provided to control logic 908 which provides control in relation flash memory array and other logic 910. Similarly, input receivers 912 and 914 receive the WP# and W/R# signals respectively to generate internal signals 'wpb' and 'wrb' respectively which are both provided to control logic 908. With respect to 'wrb', this internal signal is also provided to a MUX 966-1 and an inverter 915. NAND logic gate 917 takes as input both the output of the inverter 915 and an 'id_match' signal from the Device ID register and comparator block 307, and provides as output an 'oenb' signal.

Continuing on, input receiver 916 receives the CLE signal and generates internal signal 'clei'. Input receiver 918 receives the ALE signal and generates internal signal 'alei'. An AND logic gate 920 receives 'clei' and 'alei' and outputs signal 'dp' which will be logic high only if both 'clei' and 'alei' are logic high. After being clocked through flip-flop 922, 'dp' becomes 'en' which is in turn provided as input to write enable signal generator 924 which outputs an internal write enable signal 'wen'. The write enable signal generator 924 also receives a 'wprime' signal as input. The 'wprime' signal is outputted from AND logic gate 926, and thus the 'wprime' signal is only logic high when 'wrb' (from the input receiver 914) and 'id_match' (from the Device ID register and comparator block 307) are both logic high.

Above described signals 'dp', 'wprime' and 'en' are also provided as inputs to circuitry 928. The example circuitry 928 comprises an AND logic gate 913, an inverter 919, a first pulse generator 921, a second pulse generator 923, and an SR-latch 925. AND logic gate 913 takes 'dp' and 'wprime' as inputs and outputs logic high to the first pulse generator 921 if both 'dp' and 'wprime' are logic high, or otherwise outputs logic low to the first pulse generator 921. The inverter 919 inverts 'en' which is provided to the second pulse generator 923. Each of the pulse generators 921 and 923 generates a relatively short high pulse signal when the input signal transitions to logic high from logic low assuming that the input signal is relatively much longer than the output short pulse signal. The output of the first pulse generator 921 is provided to a "set" input of the SR-latch 925. The output of the second pulse generator 923 is provided to a "reset" input of the SR-latch 925. When the signal received at the "set" input of the SR-latch 925 transitions to logic high, 'trunc' becomes logic high in order to truncate signals from MUXs that receive 'trunc'. When the signal received at the "reset" input of the SR-latch 925 transitions to logic high, 'trunc' becomes logic low (inactive).

Still with reference to FIG. 12, the example write enable signal generator 924 of the memory device 903 includes a flip-flop 927, an OR logic gate 929 and an AND logic gate 931. The flip-flop 927 receives 'en' as input and provides 'en2' as output, clocking 'en' through as output 'en2' on rising edges of 'ick'. The OR logic gate 929 takes 'en' and 'en2' as inputs and provides 'en3' as output. The AND logic gate 931 takes 'en3' and 'wprime' as inputs and provides 'wen' as output.

Continuing on in the description of the example embodiment illustrated in FIG. 12, an input receiver 930 receives the DQS signal and generates internal signal 'dqsi'. 'Dqsi' is provided to clock doubling circuitry 935 which is employed to derive 'dqs2' having twice the frequency of 'dqsi'. Also, a multiplexer 932 receives as input both 'dqsi' and a time shifted version of 'dqsi' delayed by variable delay circuitry 934. The multiplexer 932 selects either 'dqsi' or the time shifted version of 'dqsi' based on the logic level of 'wrb' outputted from the internal receiver 914. The output of multiplexer 932 is provided as input to a logic OR gate 933, which also receives 'wprime' as input. The logic OR gate 933 provides 'dqsm' as output.

The memory device 903 also includes a plurality of input receivers 936-0 through 936-7 (one for each data input pin). Each of the input receivers 936-0 through 936-7 receive D[n] and generate a respective internal signal di[n]. Illustrated in the drawing below the input receiver 936-7 is input receiver 940. The input receiver 940 receives the DC signal and generates internal signal 'dc'.

Still with reference to FIG. 12, the example memory device 903 includes a plurality of flip-flops 950-956 to enable proper timing of signals. The flip-flop 950, which is clocked by 'ick', receives 'clei' as input and outputs 'cle_1' on a rising edge of 'ick'. Similarly the flip-flop 951, which is also clocked by 'ick', receives 'alei' as input and outputs 'ale_1' on a rising edge of 'ick'. The flip-flop 952, which is clocked by 'ick2', receives 'dqsm' as input and outputs 'dqs_1' on a rising edge of 'ick2'. Finally, there are the flip-flops 953-956 along the paths between the data input and data output pins (only those for D/Q[0] and D/Q[7] are shown for convenience of not having to illustrate similar flip-flops for D/Q[1] and D/Q[6]). Each of first stage flip-flops 953 and 954 receive an output from one of multiplexers 960 and 961. Dependent on the logic level of 'wen', the output is either 'ick2' or 'dqs2'. Thus, if 'wen' is logic high, the flip-flops 953 and 954 are clocked by 'dqs2', otherwise if 'wen' is logic low, the flip-flops 953 and 954 are clocked by 'ick2'. Once clocked through the flip-flops 953 and 954, di[0] and di[7] become dir[0] and dir[7] respectively. Dir[0] through dir[7] are provided to both the control logic 908 and data register 963.

Continuing on to second stage flip-flops 955 and 956, these are clocked by 'ick2'. Once clocked through the flip-flops 955 and 956, dir[0] and dir[7] become dif[0] and dif[7] respectively.

Still with reference to FIG. 12, the example memory device 903 includes a plurality of multiplexers (MUXs) 964-968. The MUX 964 passes 'cle_1' as output 'cleqi' when 'trunc' is logic high, or alternatively passes a logic low signal as output 'cleqi' when 'trunc' is logic low. Driver 972 takes 'cleqi' as input and outputs an amplified version of the signal on the CLEQ pin based on a timing signal (for example, the timing signal outputted from the optional DLL/PLL 980).

The MUX 965 passes 'ale_1' as output 'aleqi' when 'trunc' is logic high, or alternatively passes a logic low signal as output 'aleqi' when 'trunc' is logic low. Driver 973 takes 'aleqi' as input and outputs an amplified version of the signal on the ALEQ pin based on a timing signal (for example, the timing signal outputted from the optional DLL/PLL 980).

The MUX 966-1 passes a delayed version of 'dqs_' as output 'dqs'' when 'wrb' is logic high, or alternatively passes a non-delayed version of 'dqs_' as output 'dqs'' when 'wrb' is logic low. The output of the MUX 966-1 is electrically connected to an input of the MUX 966-2. The MUX 966-2 passes 'dqs'' as output 'dqsq' when 'oenb' is logic high, or alternatively passes the output of internal DQS generator 982 as output 'dqsq' when 'oenb' is logic low. Driver 974 takes 'dqsq' as input and outputs an amplified version of the signal on the DQSQ pin based on a timing signal (for example, the timing signal outputted from the optional DLL/PLL 980).

Still with reference to FIG. 12, the MUXs 967 and 968 are 4:1 MUXs with each having one input not used. Based on the logic levels of 'trunc' and the output of NAND logic gate 917 (oenb), the MUX 967 passes one of dif[0], dout[0] and a logic low signal as output 'qi[0]'. Driver 975 takes 'qi[0]' as input and outputs an amplified version of the signal on the Q[0] pin based on a timing signal (for example, the timing signal outputted from the optional DLL/PLL 980). The MUX 968 and driver 976 (as well as six other MUXs and six other drivers not shown) are similar to the MUX 967 and the driver 975 respectively, and each similar MUX and driver being provided in connection with one of the other output pins Q[1]-Q[7]. In an alternative example embodiment where some of the DQS and data pins for the memory device 903 are bidirectional to provide backward compatibility for legacy multi-drop (parallel) systems, drivers 988-990 are provided in addition to the drivers 974-976. This alternative example embodiment is described later in more detail. Also, drivers 991 and 992 are provided in the illustrated memory device 903. The driver 991 takes the output of the DLL/PLL 980 as input and outputs an amplified version of the DLL/PLL clock signal on the CLKO pin (or CLKO and CLKO# pins in the case where a differential clock is employed). It is noted that the illustrated memory device 903 provides for cascading clock signal distribution, which is described later in more detail.

Continuing on in the description of FIG. 12, from time to time the control logic 908 obtains information from the status register 305. Based on the information in the status register 305, the control logic 908 outputs either a logic high signal (which is interpreted to mean that the device 903 is ready to receive commands) or a logic low signal (which is interpreted to mean that the device 903 is busy). An amplified version of the logic high or low signal is outputted by the driver 992 onto the R/B# pin of the device 903.

Figure 13:
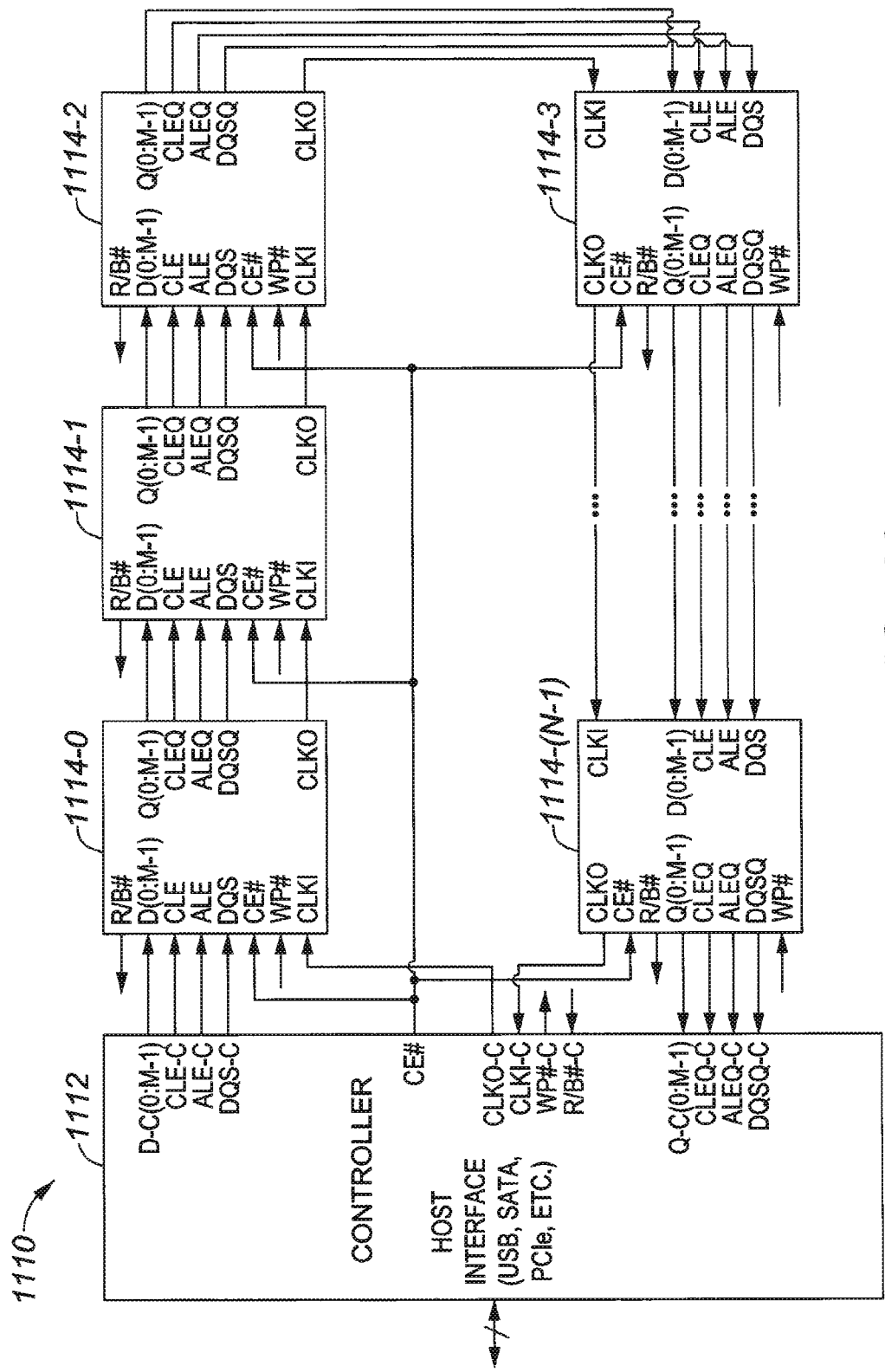
FIG. 13 is a block diagram of a plurality of memory devices connected to a controller in a point-to-point ring topology, in accordance with another non-limiting embodiment.

With reference now to FIG. 13, there is shown an alternative example memory system 1110 including a controller 1112 in communication with a plurality of semiconductor memory devices 1114-0, 1114-1, . . . , 1114-(N−1) arranged in a point-to-point ring topology. The system 1110 (in FIG. 13) is similar to the system 10 (in FIG. 1), except that the manner in which the controller 1112 distributes a clock signal to the memory devices 1114-0, 1114-1, . . . , 1114-(N−1) differs. Specifically, the controller 1112 distributes the clock signal in a cascading fashion, shown as a daisy-chain connection from a CLKO-C output of the controller 1112 to a CLKI input of memory device 1114-0, then from a CLKO output of memory device 1114-0 to a CLKI input of memory device 1114-1, etc., and finally from a CLKO output of memory device 1114-(N−1) to a CLKI-C input of the controller 1112. In this topology, therefore, each of the memory devices 1114-0, 1114-1, . . . , 1114-(N−1) includes a CLKI input port for receiving a clock signal from a previous device and a CLKO output for providing a clock signal to a neighboring device. For the illustrated non-limiting embodiment, in the case of memory device 1114-0, the previous device is the controller 1112 and the neighboring device is memory device 1114-1; in the case of memory device 1114-x (1<x<N−1), the previous device is memory device 1114-(x−1) and the neighboring device is memory device 1114-(x+1); and in the case of memory device 1114-(N−1), the previous device is memory device 1114-(N−2) and the neighboring device is the controller 1112.

By virtue of the cascaded nature of the clock signal distribution, the clock signal received at the CLKI input of even the most distant (relative to the controller 1112) memory device will be properly synchronized with the signals arriving on the other inputs (e.g., the command latch enable signal, the address latch enable signal, the information signal) of the memory device. This allows a virtually unlimited number of memory devices 1114-0, 1114-1, . . . , 1114-(N−1) to be interconnected in the topology without sacrificing signal integrity, thus providing superior memory expandability for SSD (Solid State Drive) mass storage applications.

Figure 14:
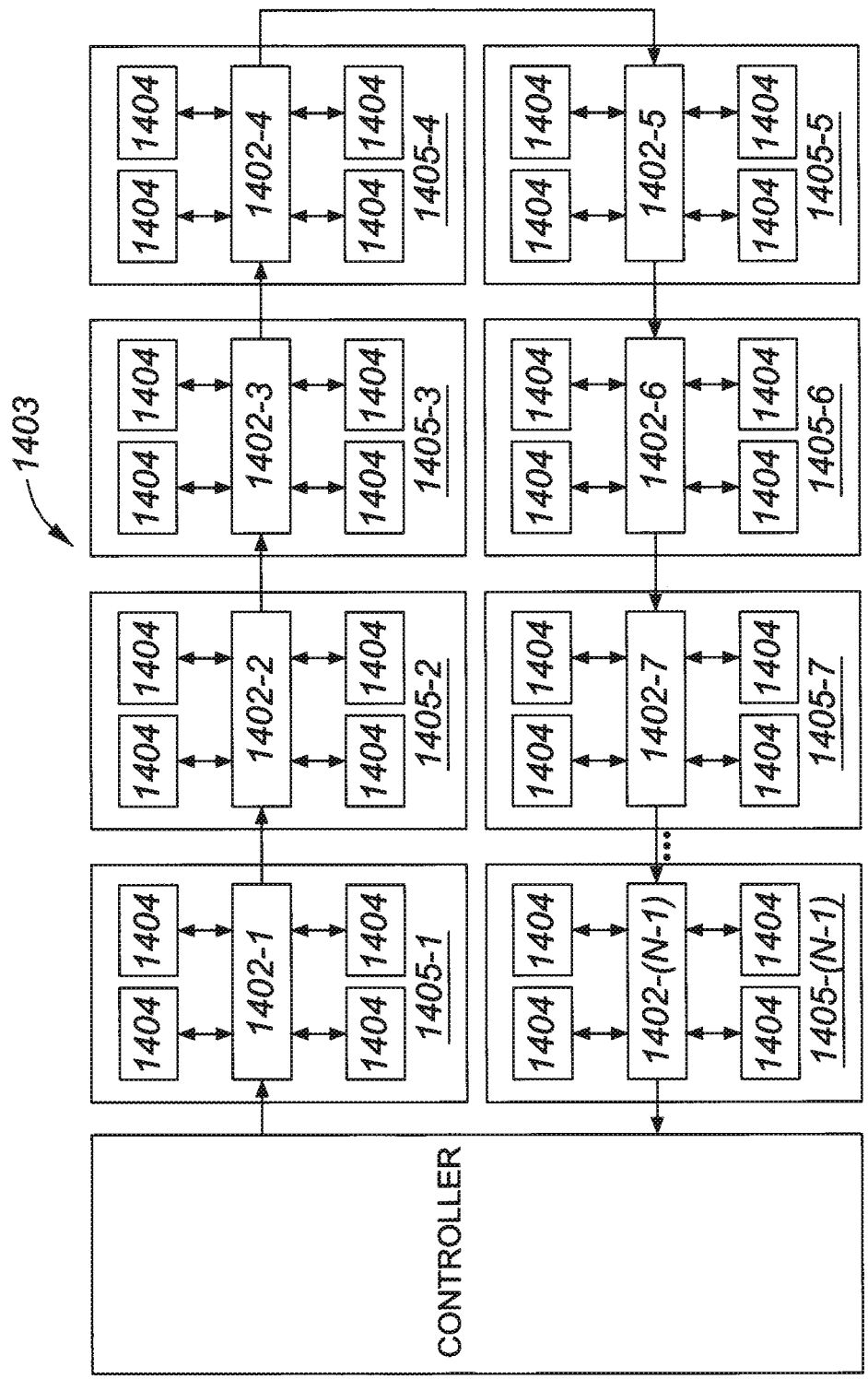
FIG. 14 is a block diagram showing, in accordance with another non-limiting embodiment, a plurality of bridge devices each grouped with respective stacks of memory devices, and the bridge devices connected to a controller in a point-to-point ring topology.

In accordance with some example embodiments, memory devices 14-0 through 14-(N−1) of FIG. 1 or memory devices 1114-0 through 1114-(N−1) of FIG. 12 in the point-to-point ring topology are replaced with bridge devices 1402-1 through 1402-(N−1) as shown in FIG. 14. The bridge devices 1402-1 through 1402-(N−1) of illustrated system 1403 are provided for converting signals in accordance the herein described communication protocol to signals in accordance with a different communication protocol (for example, a conventional communication protocol). In this manner, a plurality of memory devices 1404 responsive to a communication protocol different from the global communication protocol of the system 1403 are still compatible with the system 1403.

Also, it is contemplated that memory and bridge devices be stacked prior to mounting on a printed circuit board of the system 1403. In one example, each of stacks 1405-1 through 1405-(N−1) comprise four memory devices and one bridge devices. Other permutations are contemplated (for example, eight memory devices per bridge device). Further details concerning bridge devices and stacking are disclosed in commonly assigned patent applications U.S. Ser. No. 12/401,963 entitled "A COMPOSITE MEMORY HAVING A BRIDGING DEVICE FOR CONNECTING DISCRETE MEMORY DEVICES TO A SYSTEM" and U.S. Ser. No. 12/607,680 entitled "BRIDGE DEVICE HAVING A VIRTUAL PAGE BUFFER", and the entire contents of these patent applications are herein incorporated by reference.

In some example embodiments, a dual mode receiver block may be implemented for the optional legacy NAND flash system which requires a conventional multi-drop (parallel) configuration. Referring again to FIG. 12, when non-legacy mode is enabled, all the output drivers 988-990 are disabled. When the legacy mode is enabled, all the output drivers 988-990 are enabled, and the output drivers 972-976 and 991 are disabled and not used. Selection of the mode is done during power-up sequence, and to enable the non-legacy mode logic level received at a special pin (DC) is logic high. Once the non-legacy mode is enabled, it is the only interface that is used until the memory device 903 is powered down.

Those skilled in the art will appreciate that in some embodiments, memory devices that have been herein illustrated and described, can be imparted with their respective functionality at least partly through the use of a software program that is run on a computer. Such a software program could be encoded as computer-readable instructions on a computer-readable storage medium, the instructions being designed to produce low-level circuit diagrams and/or integrated circuit configurations for achieving the above describe functionality.

Certain adaptations and modifications of the described embodiments can be made. Therefore, the above discussed embodiments are considered to be illustrative and not restrictive.

What is claimed:

1. A system comprising:
a first semiconductor device; and
a second semiconductor device including first and second data strobe pins, the second semiconductor device being a memory device, and
the first semiconductor device being configured to output a first data strobe signal providing synchronous reference for input data to be received by the second semiconductor device via the first data strobe pin, and
the second semiconductor device configured to output, via the second data strobe pin, a second data strobe signal providing synchronous reference for output data, and
wherein the first and second data strobes are both intermittently driven timing signals.

2. The system as claimed in claim 1 wherein the second data strobe signal is an echo of the first data strobe signal.

3. The system as claimed in claim 1 wherein at least the second semiconductor device further includes an input for receiving a mode signal indicative of whether the second semiconductor device has been placed in a read mode or a write mode by a controller of the system.

4. The system as claimed in claim 1 wherein the second semiconductor device further includes a plurality of additional pins for receiving a command latch enable signal and an address latch enable signal from the first semiconductor device.

5. The system as claimed in claim 1 wherein first and second data strobe pins are unidirectional pins.

6. The system as claimed in claim 1 wherein the first data strobe pin is configured to operate as a bidirectional data strobe pin when the system is a multi-drop system.

7. The system as claimed in claim 1 further comprising a third semiconductor device, and wherein the first, second and third semiconductor device are arranged in a point-to-point ring topology.

8. The system as claimed in claim 1 wherein the memory device is a flash memory device.

9. The system as claimed in claim 8 wherein the flash memory device is a NAND flash memory device.

10. The system as claimed in claim 1 wherein the second semiconductor device further includes a device identification register and an identification comparator, and the identification comparator is configured to compare device identification information receivable by the second semiconductor device with information stored in the device identification register to determine whether the second semiconductor device is a target device for a command.

11. The system as claimed in claim 1 wherein the second semiconductor device further includes a clock input pin configured to receive a device-external clock signal.

12. A method comprising:
receiving, via a first data strobe pin of a semiconductor memory device, a first data strobe signal that provides synchronous reference for input data; and
outputting, via a second data strobe pin of the semiconductor memory device, a second data strobe signal providing synchronous reference for output data, and
wherein the first and second data strobes are both intermittently driven timing signals.

13. The method as claimed in claim 12 wherein the second data strobe signal is an echo of the first data strobe signal.

14. The method as claimed in claim 12 further comprising receiving a mode signal indicative of whether the semiconductor memory device has been placed in a read mode or a write mode by a controller.

15. The method as claimed in claim 12 further comprising receiving a command latch enable signal and an address latch enable signal.

16. The method as claimed in claim 12 wherein the semiconductor memory device is a flash memory device.

17. The method as claimed in claim 16 wherein the flash memory device is a NAND flash memory device.

* * * * *